United States Patent
Eom et al.

(10) Patent No.: US 11,749,527 B2
(45) Date of Patent: Sep. 5, 2023

(54) METAL-ORGANIC PULSED LASER DEPOSITION FOR STOICHIOMETRIC COMPLEX OXIDE THIN FILMS

(71) Applicant: Wisconsin Alumni Research Foundation, Madison, WI (US)

(72) Inventors: Chang-Beom Eom, Madison, WI (US); Jungwoo Lee, Madison, WI (US)

(73) Assignee: Wisconsin Alumni Research Foundation, Madison, WI (US)

(*) Notice: Subject to any disclaimer, the term of this patent is extended or adjusted under 35 U.S.C. 154(b) by 0 days.

(21) Appl. No.: 17/814,565

(22) Filed: Jul. 25, 2022

(65) Prior Publication Data

US 2022/0367184 A1     Nov. 17, 2022

Related U.S. Application Data

(62) Division of application No. 16/985,455, filed on Aug. 5, 2020, now Pat. No. 11,437,234, which is a division of application No. 16/252,783, filed on Jan. 21, 2019, now Pat. No. 10,796,907.

(51) Int. Cl.
| | |
|---|---|
| *H01L 21/02* | (2006.01) |
| *C23C 14/08* | (2006.01) |
| *H01L 29/24* | (2006.01) |
| *C23C 14/28* | (2006.01) |
| *H01L 29/778* | (2006.01) |

(52) U.S. Cl.
CPC ...... *H01L 21/02565* (2013.01); *C23C 14/088* (2013.01); *C23C 14/28* (2013.01); *H01L 21/02414* (2013.01); *H01L 21/02631* (2013.01); *H01L 29/24* (2013.01); *H01L 29/778* (2013.01)

(58) Field of Classification Search
None
See application file for complete search history.

(56) References Cited

U.S. PATENT DOCUMENTS

2014/0048796 A1*   2/2014   Baek .................. H01L 29/7786
                                                               257/43

OTHER PUBLICATIONS

Schlom et al., "A Thin Film Approach to Engineering Functionality into Oxides", J. Am. Ceram. Soc., 91; [8] 2429-2454 (2008). (Year: 2008).*

* cited by examiner

*Primary Examiner* — Asok K Sarkar
(74) *Attorney, Agent, or Firm* — BELL & MANNING, LLC

(57) ABSTRACT

Methods and systems for forming complex oxide films are provided. Also provided are complex oxide films and heterostructures made using the methods and electronic devices incorporating the complex oxide films and heterostructures. In the methods pulsed laser deposition is conducted in an atmosphere containing a metal-organic precursor to form highly stoichiometric complex oxides.

12 Claims, 9 Drawing Sheets

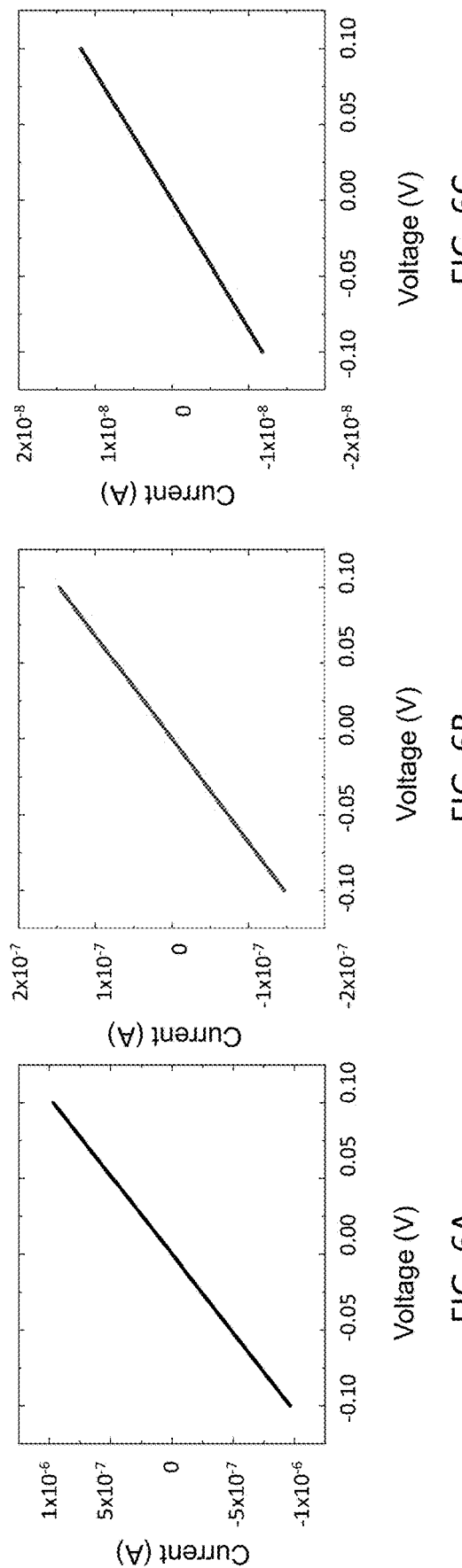

METAL-ORGANIC PULSED LASER DEPOSITION FOR STOICHIOMETRIC COMPLEX OXIDE THIN FILMS

CROSS REFERENCE TO RELATED APPLICATIONS

The present application is a divisional of U.S. patent application Ser. No. 16/985,455 that was filed Aug. 5, 2020, which is a divisional of U.S. patent application Ser. No. 16/252,783 that was filed on Jan. 21, 2019 and issued as U.S. Pat. No. 10,796,907 on Oct. 6, 2020, the entire contents of which are incorporated herein by reference.

REFERENCE TO GOVERNMENT RIGHTS

This invention was made with government support under DE-FG02-06ER46327 awarded by the US Department of Energy. The government has certain rights in the invention.

BACKGROUND

Complex oxide systems have attracted scientific focus for plenty of interesting physics and emergent phenomena including ferroelectricity, ferromagnetism, and superconductivity. For practical applications, fabrication and characterization of thin films and their heterostructures have been intensively studied. However, even if thin films are grown epitaxially on proper substrates, their quality is often inferior to bulk single crystals. Non-equilibrium thin-film growth conditions lead to non-stoichiometry and additional point defects, whilst most single crystal growth is under near-equilibrium conditions. An analogous near-equilibrium synthesis process for complex oxide thin films would result in materials with low concentration of point defects, opening pathways to new functionalities.

Pulsed laser deposition (PLD) is one of the most widespread methods of complex oxide thin film growth, primarily because of the accurate transfer of target composition to the films, and sharp interfaces of resulting heterostructures. However, the non-equilibrium nature of PLD growth leads to a density of point defects much larger than that required to observe quantum phenomena in most materials systems. Recently, a hybrid MBE process using Sr metal and TTIP gas as source materials showed a growth window yielding stoichiometric $SrTiO_3$ films. (B. Jalan, et al., *Appl. Phys. Lett.* 95, 032906 (2009); B. Jalan, et al., *J. Vac. Sci. Technol. A* 27, 461 (2009); and J. Son, et al., *Nat. Mater.* 9, 482 (2010).) La-doped $SrTiO_3$ films grown with this hybrid MBE process exhibited electron mobilities of ~32,000 $cm^2V^{-1}s^{-1}$ at low temperature, higher than that of electron-doped bulk $SrTiO_3$ single crystals. (J. Son, et al., 2010 and A. Spinelli, et al., *Phys. Rev. B.* 81, 155110 (2010).) A PLD-based near-equilibrium process would dramatically expand the range of low-defect materials and heterostructures due to the ease of incorporating with existing wide-ranging PLD growth schedules.

SUMMARY

Methods for forming complex oxide films are provided. Also provided are complex oxide films and heterostructures made using the methods and electronic devices incorporating the complex oxide films and heterostructures. Some embodiments of the heterostructures are two-dimensional electron gas-forming heterostructures.

One embodiment of a method for forming a complex oxide film includes the steps of: providing a deposition substrate and at least one metal oxide target comprising a first cation metal and oxygen in a deposition chamber; introducing a metal-organic precursor comprising a second cation metal and oxygen into the deposition chamber; and laser ablating the metal oxide target using a pulsed laser in the presence of the metal-organic precursor to generate a flux of the metal oxide, wherein the metal oxide and the metal and oxygen from the metal-organic precursor are sequentially deposited onto the deposition substrate to form a layered complex oxide film.

One embodiment of a two-dimensional electron gas-forming heterostructure includes: a $DyScO_3$ substrate or a $GdScO_3$ substrate; a tensilely strained $SrTiO_3$ film on the $DyScO_3$ substrate or the $GdScO_3$ substrate; and a $LaAlO_3$ film on the tensilely strained $SrTiO_3$ film, wherein a two-dimensional electron gas is formed at the interface between the $SrTiO_3$ film and the $LaAlO_3$ film.

One embodiment of a two-dimensional electron gas-forming heterostructure includes: a $(LaAlO_3)_{0.3}$—$(Sr_2AlTaO_6)_{0.7}$ substrate or a $NdGaO_3$ substrate; a compressively strained $SrTiO_3$ film on the $(LaAlO_3)_{0.3}$—$(Sr_2AlTaO_6)_{0.7}$ substrate or the $NdGaO_3$ substrate; and a $LaAlO_3$ film having a thickness of 9 unit cells or fewer on the compressively strained $SrTiO_3$ film, wherein a two-dimensional electron gas is formed at the interface between the $SrTiO_3$ film and the $LaAlO_3$ film.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 2A, panels (a)-(c), show the physical process during STO film growth in conventional PLD. FIG. 2A, panel (a) shows that the flux of $SrTiO_{3-\delta}$, $SrO_x$, $TiO_y$ is supplied on $TiO_2$-terminated STO substrate by pulsed laser ablation of a STO target. FIG. 2A, panel (b) shows the film growth on the substrate. Note that there is no driving force to achieve perfect cation stoichiometry. The cation stoichiometry is mainly governed by the flux ratio of Sr/Ti. FIG. 2A, panel (c) shows that after the film growth, non-stoichiometric STO is formed. FIG. 2A, panels (d)-(f) show the physical process during STO film growth in MOPLD. FIG. 2A, panel (d) shows that $SrO_x$ flux is supplied by pulsed laser ablation of a SrO target. TTIP is simultaneously supplied but not adsorbed on $TiO_2$-terminated STO surface. FIG. 2A, panel (e) shows that TTIP is only adsorbed and decomposed to form $TiO_2$ layer on top of SrO-terminated STO, which results in FIG. 2A, panel (f), perfect stoichiometry by self-regulation.

FIG. 3A shows out-of-plane θ-2θ XRD patterns of STO films on (001) STO substrates. (002) peak positions of off-stoichiometric STO films and $Sr_2TiO_4$ are indicated by the grey and black arrows, respectively. FIG. 3B shows Raman spectra of STO films on (001) STO substrates at 10 K. Data from Sr-rich, stoichiometric, Ti-rich STO (determined by XRD) films are represented in the two lower traces, three middle traces, and two upper traces, respectively. FIG. 3C shows normalized $TO_4$ intensity in Raman spectra (FIG. 3B) as a function of TTIP inlet pressure. Because the sample grown at 9 and 10 mTorr has $Sr_2TiO_4$ phase, those samples were excluded in this plot. The shaded area is a stoichiometric growth window determined by Raman spectra at 10 K.

FIG. 4A shows temperature dependence of electron mobility at the interface of LAO 5 u.c./(001) STO substrate and LAO 5 u.c./MOPLD-grown STO 12 u.c./(001) STO substrate. TTIP gas inlet pressures of 15-23 mTorr were employed for growing STO 12 u.c. films. FIG. 4B shows electron mobility at 2 K in LAO 5 u.c./MOPLD-grown STO 12 u.c./(001) STO substrate as a function of TTIP gas inlet pressure. Structural growth window determined by Raman (FIG. 3C) is represented by the shaded area. FIG. 4C shows SdH oscillation of LAO 5 u.c./MOPLD-grown STO 12 u.c./(001) STO substrate where TTIP gas inlet pressure of 21 mTorr was used for the STO 12 u.c. film.

FIG. 5A shows DRCLS Spectra of LAO 5 u.c./MOPLD-grown STO 12 u.c./(001) STO substrate where TTIP gas inlet pressure of 15, 21 mTorr was used for the STO 12 u.c. films, respectively. The probe beam voltage of 0.3 kV was used for detecting the signals from MOPLD-grown STO film. FIG. 5B shows spectra deconvoluted using 10 Gaussian curves with the constant baseline. Defect features of 1.6, 1.7, 1.9, 2.1, 2.4, 3.0 eV, an indirect band gap of 3.25 eV, a direct bandgap of 3.6 eV, and upper conduction bands from Ti-3d splitting of 4.0 and 4.3 eV were identified. Note that Ti-3d orbital related conduction band features at 3.6 eV, 4 eV, and 4.3 eV are virtually identical when normalized in the STO substrate. FIG. 5C shows relative defect concentration of STO films as a function of TTIP gas inlet pressure during the growth. Each defect area of $Ti_{Sr}^{2+}$, $V_O^{2+}$, $Ti^{3+}$ was normalized with respect to the bandgap area near 3.6 eV. FIG. 5D shows relative oxygen vacancy density across the interfaces.

FIGS. 6A-6C show current-voltage curves for a LAO/STO/STO heterostructure (FIG. 6A), a LAO/STO/LSAT heterostructure (FIG. 6B), and a LAO/STO/DSO heterostructure (FIG. 6C).

DETAILED DESCRIPTION

Methods and systems for forming complex oxide films are provided. Also provided are complex oxide films and heterostructures made using the methods and electronic devices incorporating the complex oxide films and heterostructures.

One embodiment of a method of forming a complex oxide film includes the steps of: (a) providing a deposition substrate and at least one metal oxide target in a deposition chamber, the at least one metal oxide target comprising a first cation metal and oxygen; (b) introducing a metal-organic precursor comprising a second cation metal and oxygen into the deposition chamber; and (c) laser ablating the metal oxide target using a pulsed laser in the presence of the metal-organic precursor to generate a flux of the metal oxide from the metal oxide target. In this method, the ablated metal oxide serves as the source of the first cation metal, and the metal-organic precursor serves as the source of the second cation metal in the growing complex oxide film. This method, in which PLD is conducted in an atmosphere containing a metal-organic precursor, is referred to herein as MOPLD. As illustrated in the Example, the methods can be used to form films of $SrTiO_3$ (STO) from SrO targets and titanium-containing metal-organic precursor molecules, such as titanium tetraisopropoxide. However, a wide variety of complex oxides can be made using the methods by selecting the appropriate target metal oxides and metal-organic precursors.

The methods provide near-equilibrium growth conditions that result in a reduced cation point defect concentration and, therefore, improved stoichiometric growth of complex oxide films, relative to complex oxide films grown using more conventional techniques. As demonstrated in the Example, complex oxide films having a lower oxygen vacancy concentration than their corresponding bulk oxide can be grown. The stoichiometric complex oxides can be grown within a wide range of metal-organic precursor fluxes and, since the pulsed laser deposition target contains oxygen, without the need for a separate dedicated oxygen source. This enables the use of deposition systems that are more compact and less expensive than conventional complex oxide growth systems.

Complex metal oxides include two or more metal cations and oxygen. The complex metal oxides made using the methods described herein have a layered structure in which layers of a first cation metal and oxygen alternate with layers of a second cation metal and oxygen. A variety of metal oxides can be grown using the methods, including metal oxides that are insulators, ferromagnets, antiferromagnets, piezoelectrics, and superconductors.

Figure 1:
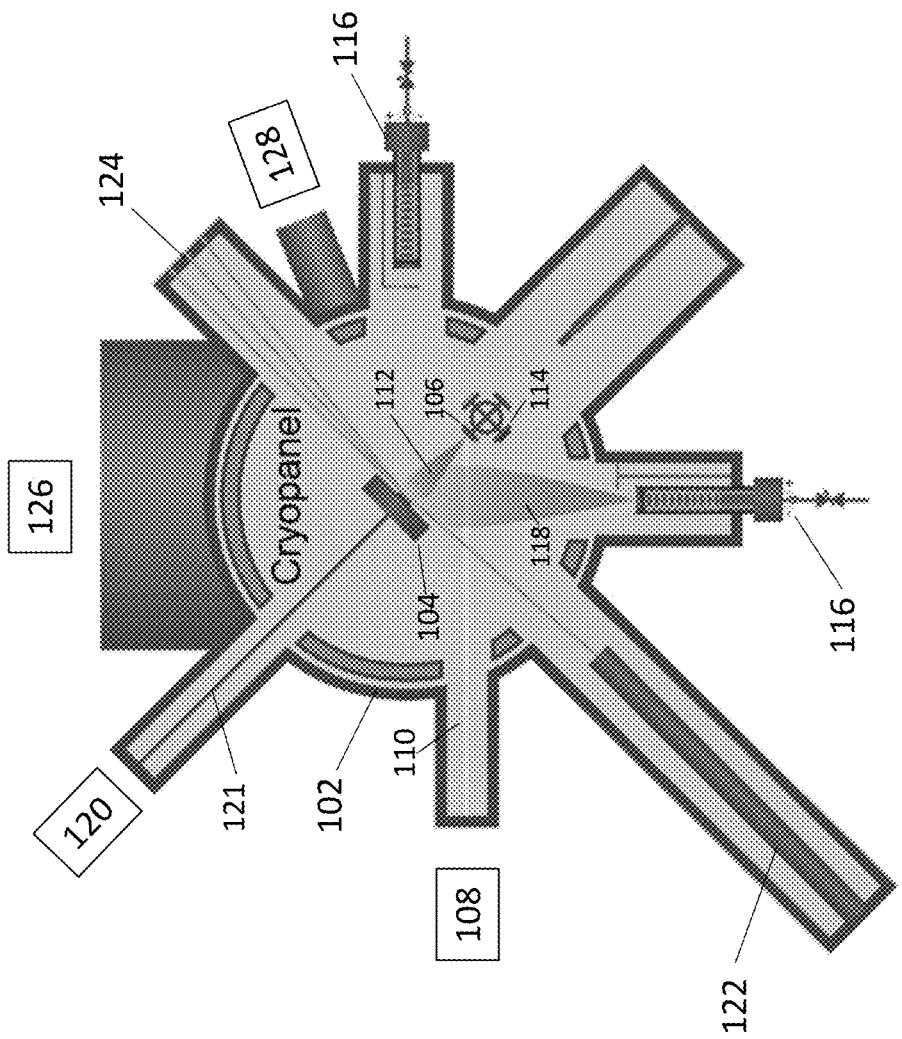
FIG. 1 depicts a schematic of a metal-organic pulsed laser deposition system. In addition to PLD system with high pressure RHEED, gas supply systems are combined.

One embodiment of a system for carrying out the growth of a complex oxide film is shown in FIG. 1. The system includes a deposition chamber 102 that houses a substrate 104 on which the complex oxide film is grown and at least one pulsed laser deposition (PLD) target 106. The system further includes a laser 108, such as an excimer laser, configured to direct a laser beam 110 onto the surface of the PLD target to enable the target material, generating a target material plume 112 comprising metal oxide species.

The PLD targets are made of a target material that includes at least one cation metal of the complex oxide to be grown and oxygen. However, the PLD target does not include all of the elements of the complex oxide film to be grown and, therefore, is not a stoichiometric target of the type used in conventional PLD.

If more than one type of complex oxide film is to be grown, deposition chamber 102 can house a plurality of different PLD targets that correspond to the different complex oxides. As illustrated in FIG. 1, the different PLD targets can be provided on a rotating and/or translating PLD target carousel 114 configured to allow each of the targets to move in and out of the path of laser beam 110.

A metal-organic precursor source is provided in fluid communication with the deposition chamber to allow for the introduction of a metal-organic precursor into deposition chamber 102 during the PLD of the PLD target. For example, the metal-organic precursor source may be in fluid communication with the deposition chamber via one or more gas injectors 116. Gas injector 116 is configured to direct a flux of the metal-organic precursor 118 toward the surface of substrate 104. Additional gas injectors can be used to introduce additional organic precursors. These organic precursors may include additional metal atoms and/or dopant atoms to grow complex oxide films containing more than two metals and/or doped complex oxide films. For example, organic precursors including a dopant atom, such as nitrogen, can be introduced into the deposition chamber during the PLD of the target oxide. By way of illustration, tetrakis (dimethylamido)titanium (TDMAT) can be used as a dopant precursor along with the TTIP to grow nitrogen-doped STO films.

The deposition system may also include a heat source in thermal communication with substrate 104 in order to heat the substrate to an annealing temperature and/or to maintain the substrate at a selected complex oxide film deposition temperature. For example, the heat source could be a second laser 120 that directs a second laser beam 121 onto substrate 104 or a substrate holder, as shown in FIG. 1. Alternatively, the heat source could be a heating element in physical contact with substrate 104 or a substrate holder. Optionally, a RHEED system including a RHEED gun 122 and RHEED screen 124, configured to monitor the growth of the complex oxide film, can be included in the deposition system. One or more pumps 126, 128 are used to reduce the pressure in the deposition chamber to a pressure suitable for the deposition of the complex oxide film.

Because the deposition methods do not rely on a separate oxygen source, such as a plasma source or an $O_2$ tank, to provide oxygen, the deposition of the complex oxide can be done in an oxygen-free or substantially oxygen-free environment. It may be very difficult or impossible to remove all oxygen from the deposition chamber; therefore, the deposition chamber can be considered substantially free of oxygen if the oxygen partial pressure in the chamber is $1\times10^{-6}$ torr or lower and, more typically, much lower (for example, in the range from $1\times10^{-8}$ to $1\times10^{-9}$ torr, or lower.

Figure 2A:
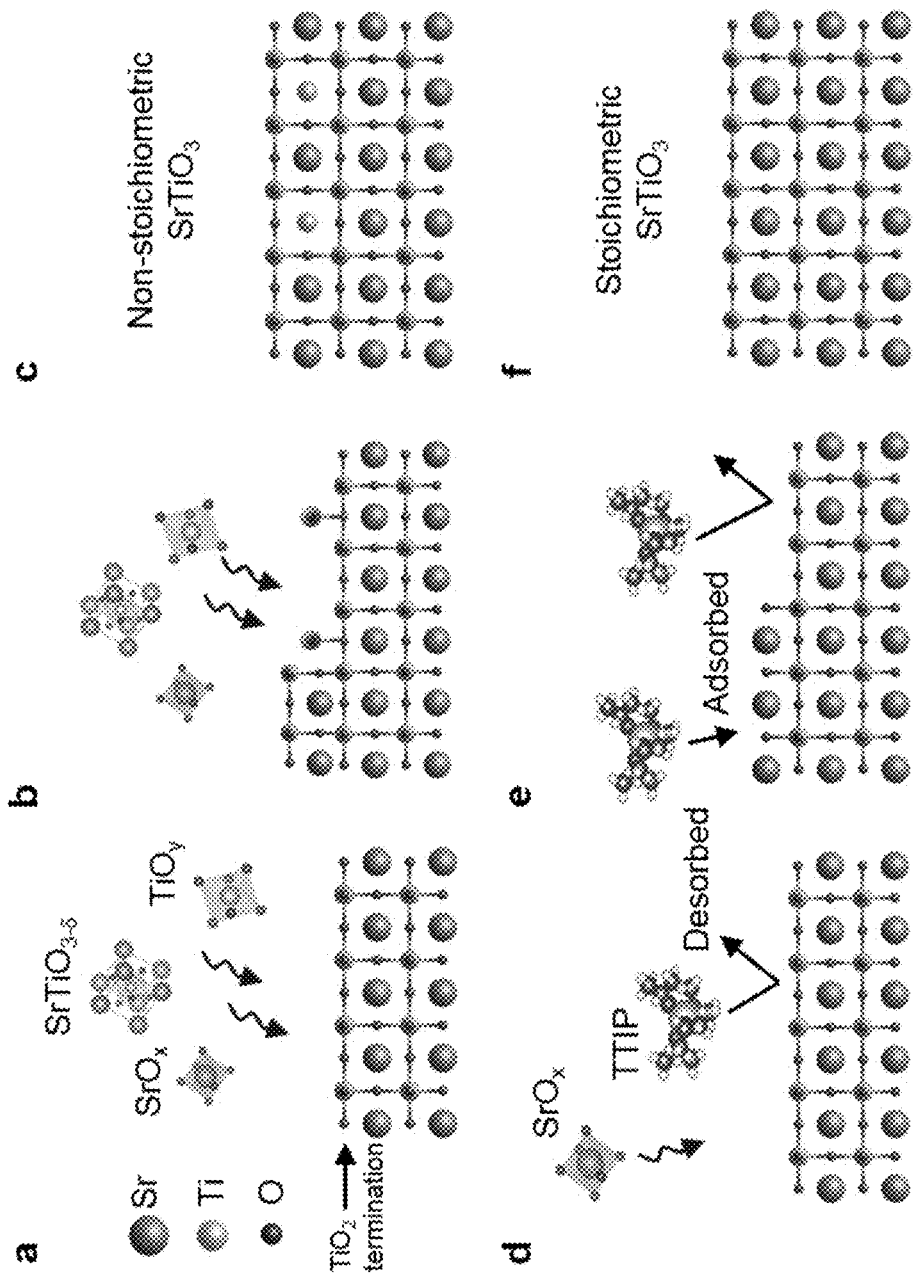
FIG. 2A, panels (a)-(f) and FIG. 2B depict physical processes of STO film growth and corresponding atomic structures by conventional PLD and MOPLD.

An initial stage in the growth of the complex oxide film is the deposition of a layer of the PLD target oxide onto the surface of the substrate from the target material plume to form a surface that is terminated by the metal oxide of the PLD target. For example, during the growth of an STO film, a SrO PLD target can be used to form an SrO-terminated surface. The next layer in a layered complex oxide can then be formed via adsorption-controlled deposition of the second cation metal and oxygen on the metal oxide terminated surface via the decomposition of the metal-organic precursor. By way of illustration, during the growth of the STO film, a TTIP precursor can be used to deposit titanium and oxygen to form a $TiO_2$ layer on the previously deposited terminal SrO layer. Without intending to be bound to any particular theory of the invention, a proposed adsorption-controlled growth mechanism is shown in FIG. 2A. The deposition should be conducted at a temperature at which the metal-organic precursor preferentially adsorbs and decomposes on the metal oxide previously deposited from the PLD target (FIG. 2A, panel (e)) and preferentially desorbs from the metal oxide previously deposited from the metal-organic precursor (FIG. 2A, panels (d) and (e)). This adsorption-controlled growth illustrated in FIG. 2A, panels (d)-(f), enables cation stoichiometry to be maintained in the growing film throughout the growth process. Moreover, the near-equilibrium nature of the MOPLD process makes it possible to achieve stoichiometric complex oxide growth over a wide range of metal-organic precursor flux conditions. The growth stages can continue iteratively until a complex oxide film having the desired thickness is formed.

The deposition process can be carried out for a time sufficient to grow a complex oxide film having a desired thickness. This includes ultrathin films having thicknesses of 20 unit cells (u.c.) or fewer. For example, the films can have a thickness in the range from 4 u.c. to 20 u.c. However, thicker films can also be grown.

The substrates on which the complex oxide films are grown can be composed of bulk crystals having the same complex oxide composition as the films. For example, STO can be deposited on the (001) face of a bulk STO single crystal. However, the complex oxide films also can be grown on substrates of different materials. Thus, the present methods allow for the formation of complex oxide films on a variety of substrates that are commonly used in the electronics industry. For example, an STO film could be deposited on bulk (001) silicon (Si), (001) $(LaAlO_3)_{0.3}$—$(Sr_2AlTaO_6)_{0.7}$ (LSAT), (110) $NdGaO_3$ (NGO), (110) $DyScO_3$ (DSO), and (110) $GdScO_3$ (GSO). Depending upon the lattice match between the growth substrate and the complex oxide, the complex oxide films may be grown in an unstrained state or in a strained state, including compressive and tensile strain states. Generally, the substrates should be selected to have a sufficiently low lattice mismatch with the complex oxide film that strain-induced defects are avoided or minimized in the film. In addition, the substrate should be chemically compatible with the complex oxide film—that is, it should not react with the complex oxide in a way that significantly degrades the chemical and/or physical properties of the complex oxide film. Notably, the present methods can be used to fabricate heterostructures with a 2DEG at an interface even when the complex oxide film is under a tensile strain or when the complex oxide film is under a compressive strain and the overlying complex oxide has a critical thickness for 2DEG formation that is less than 10 u.c. As illustrated in the examples, the critical thickness for 2DEG formation in some embodiments of the compressively strained heterostructures can be less than 8 u.c., less than 6 u.c., or equal to 5 u.c.

Because the complex oxide films can be formed with the same concentration or a lower concentration of point defects than their bulk crystal counterparts, heterostructures that were previously grown only on bulk crystals of the complex oxides can now be grown on the thin crystalline complex oxide films. In the heterostructures, the various material layers that are formed on the complex oxide films can be formed using the methods described herein or by other known deposition techniques. Examples of heterostructures that can be grown on an insulating complex oxide film are two-dimensional electron gas (2DEG)-forming heterostructures. These heterostructures are insulating oxide bilayers that include a complex oxide film, as described herein, and an overlying film of a second complex oxide, wherein a 2DEG is formed at the polar/non-polar oxide interface of the two oxides. Such 2DEG-forming heterostructures are useful in a variety of electronic devices, including field-effect transistors and non-volatile memory elements.

As illustrated in the Example, one heterostructure that forms a 2DEG at an oxide interface and that can be fabricated via MOPLD is the $LaAlO_3/STO$ (LAO/STO) interface, which is of significant interest to the electronics industry. LAO/STO heterostructures having an electron mobility of $10^3$ cm$^2$/V·s or higher (e.g., in the range from $10^3$ cm$^2$/V s to $10^4$ cm$^2$/V·s) at temperatures of 20 K or lower (e.g., in the range from 2 to 20 K) can be fabricated. Such high mobilities are indicative of the very high quality of the STO films. In fact, the electron mobilities in the 2DEGs that are formed by growing a second oxide on a complex oxide film can be even higher than the electron mobilities in 2DEGs that are formed by growing the same second oxide on a bulk complex oxide substrate under the same growth conditions. Such high mobilities can be achieved with high charge carrier densities, including charge carrier densities of $10^{13}$ or higher.

Although much of the discussion provided above and in the example below uses STO films to illustrate the deposition methods, it should be understood that the methods can be used to form other complex oxides by using different PLD targets and different metal-organic precursors. Examples of metal oxide target materials include target materials that have the formula $MO_x$, where M represents a metal atom and x can be, for example, in the range from 1 to 2. Other target metal oxides include those that have the formula $M_{1-x}M''_xO$, where M and M'' are two different cation metals and $0<x<1$, although x can have a value outside of this range. Complex metal oxides that can be made from these targets include those that have the formula $MM'O_3$ and $M_{1-x}M''_xO_3$.

By way of illustration only, $BaTiO_3$, $CaTiO_3$, and $SnTiO_3$ films can be deposited using BaO, CaO, and SnO, respectively, as target materials and TTIP (with or without TDMAT) as a metal-organic precursor; $Ba_{1-x}Sr_xTiO_3$ films can be deposited using $Ba_{1-x}Sr_xO$ as a target material and TTIP (with or without TDMAT) as a metal-organic precursor; $SrVO_3$ and $BaVO_3$ films can be deposited using SrO and BaO, respectively, as target materials and vanadium (V) oxytrisopropoxide as a metal-organic precursor; $SrZrO_3$ and $BaZrO_3$ can be deposited using SrO and BaO, respectively, as target materials and zirconium (IV) tetra-butoxide as a metal-organic precursor; and $SrHfO_3$ and $BaHfO_3$ films can be deposited using SrO and BaO, respectively, as target materials and hafnium (IV) tetra-butoxide as a metal-organic precursor. Guidance for the selection of other metal-organic precursors can be provided by referring to the chemical vapor deposition (CVD) literature. Suitable substrates upon which these and other complex oxide films can be grown include $YAlO_3$, $LaAlO_3$, $NdGaO_3$, $LaGaO_3$, LSAT, STO, $DyScO_3$, $GdScO_3$, and $PrScO_3$ substrates.

EXAMPLES

Example 1: This example illustrates the defect-free synthesis of $LaAlO_3/SrTiO_3$ quantum heterostructures via the MOPLD growth technique, which uses TTIP as a Ti source during laser ablation of a SrO target. A stoichiometric growth window of STO for a wide flux range of TTIP makes for a robust deposition process. The defect reduction was quantified by measuring an electron mobility at the interface of $LaAlO_3$/MOPLD-grown $SrTiO_3$ higher than that at a $LaAlO_3$/bulk $SrTiO_3$ substrate interface. Clean Shubnikov-de Haas oscillations were measured, a signature of high-mobility arising from low defect concentration.

A comparison of $SrTiO_3$ film growth by conventional PLD and MOPLD is shown in FIG. 2A panels (a)-(c) and FIG. 2A panels (d)-(f), respectively. The PLD growth mechanism is complex, but recent in-situ analysis of the ablation plume showed that not only $SrTiO_{3-x}$ species, but also $SrO_x$ and $TiO_y$ are separately transferred from the target to the substrate during conventional PLD growth (FIG. 2A, panel (a)). (S. Wicklein, et al., *Appl. Phys. Lett.* 101, 131601 (2012).) During conventional PLD laser ablation, supersaturation and growth of $SrTiO_3$ occur on the substrate. Laser fluence and spot size affect the degree of supersaturation, which determines the stoichiometry of the films (FIG. 2A, panels (b) and (c)). (T. Ohnishi, et al., *J. Appl. Phys.* 103, 103703 (2008).)

Figure 2B:
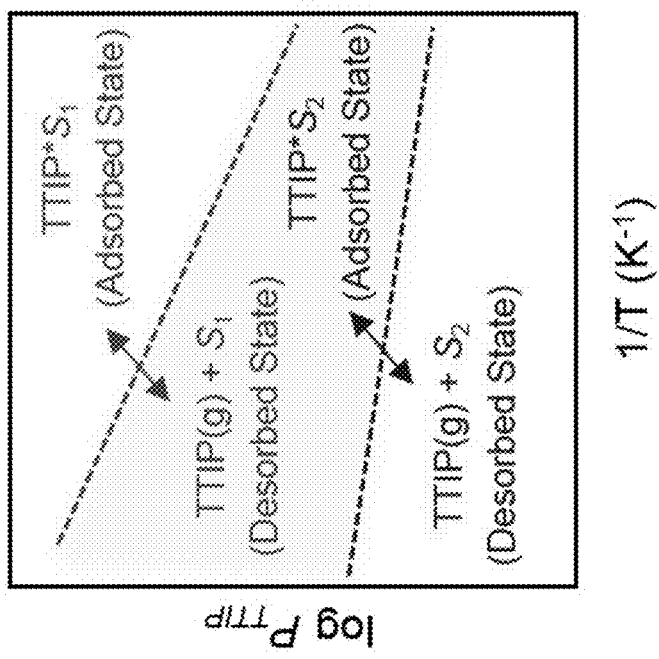
FIG. 2B shows the schematics depicting thermodynamic consideration for selective adsorption of TTIP in log $P_{TTIP}$ vs. $1/T$ ($K^{-1}$) diagram. Above each dashed line, TTIP adsorption on $TiO_2$— or SrO-terminated STO is energetically favorable. Between the two lines (shaded region), a selective adsorption of TTIP on SrO-terminated surface occurs, resulting in the growth of stoichiometric STO films.

During MOPLD, the total working pressure should be low enough to minimize the gas phase reaction of TTIP so that surface reaction of TTIP is dominant (FIG. 2A panel (d)). In addition, the growth temperature should be high enough to enable TTIP adsorption on a SrO-terminated $SrTiO_3$ surface while it is desorbed from a $TiO_2$-terminated $SrTiO_3$ surface (FIG. 2A, panel (e)). Under such conditions, TTIP will be decomposed on top of a SrO-terminated $SrTiO_3$ surface only, resulting in the growth of stoichiometric $SrTiO_3$ (FIG. 2A, panel (f)). The Arrhenius behavior of adsorption means that the reaction curve would be a line in log $P_{TTIP}$ vs. 1/T diagram as shown in FIG. 2B. The stoichiometric growth window then lies between the upper and lower dashed lines.

Figures 3A, 3B, 3C:
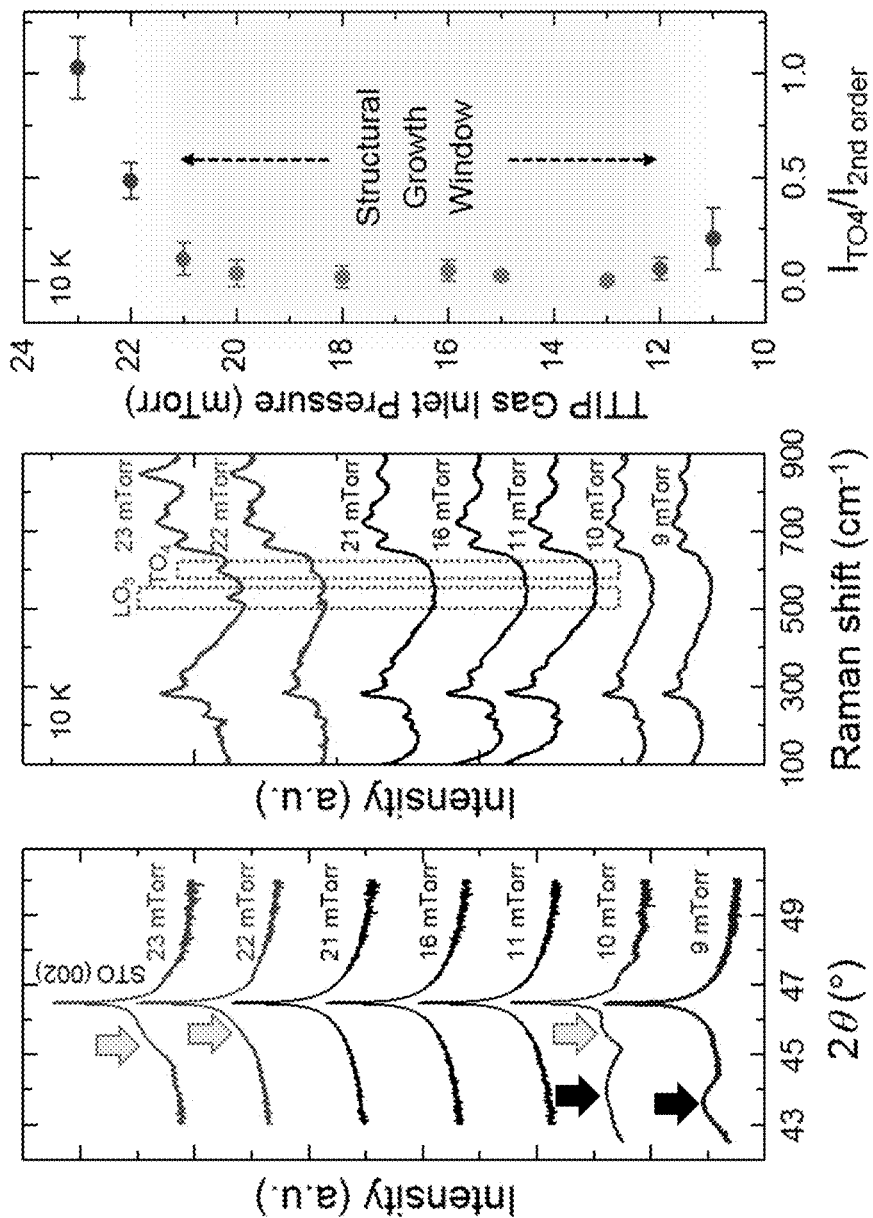
FIG. 3A-FIG. 3C depict structural analysis of STO films grown by MOPLD.

Based on this concept, 25-unit cell thick $SrTiO_3$ thin films were grown on (001) $SrTiO_3$ substrates by the MOPLD method. The laser conditions for SrO flux were fixed while TTIP flux was varied and controlled by a gas pressure feedback system. Details of film growth are provided below. FIG. 3A shows out-of-plane θ-2θ XRD patterns of $SrTiO_3$ films vs. TTIP inlet pressure. Since the $SrTiO_3$ lattice parameter is highly sensitive to its stoichiometry, lattice parameters different from those of the single crystal substrate value arise from cation off-stoichiometry. The data indicate that there is a stoichiometric $SrTiO_3$ growth window within the wide range of TTIP gas inlet pressures from 11 to 21 mTorr. In this region, $SrTiO_3$ film peaks overlap those of the $SrTiO_3$ single crystal substrate, indicating stoichiometric films. At lower TTIP gas inlet pressure (9 and 10 mTorr), both off-stoichiometric $SrTiO_3$ and a $Sr_2TiO_4$ second phase were detected by XRD. The layer-by-layer growth mode of $SrTiO_3$ growth was monitored with in-situ reflective high electron energy diffraction (RHEED). In addition, an atomic force microscopy (AFM) image of the surface of the $SrTiO_3$ film after the growth shows a step-terrace structure. $SrTiO_3$ films were also grown on $(LaAlO_3)_{0.3}(Sr_2TaAlO_6)_{0.7}$ (LSAT) substrates with the MOPLD method. These films exhibited a full width at half maximum value of 0.021° in an X-ray diffraction rocking curve, giving evidence to high crystal quality, and were fully coherent to the LSAT substrate. Hence, the MOPLD method is applicable to both strained and unstrained films.

Variable-temperature Raman spectroscopy was performed to investigate any signature of inversion symmetry breaking due to point defects. $SrTiO_3$ is a cubic perovskite (space group Pm-3m) with 12 optical phonon modes. Because these phonon modes have odd symmetry with respect to the inversion center, $1^{st}$ order Raman peaks are not present in the ideal $SrTiO_3$ structure. Any point defects which break inversion symmetry of $SrTiO_3$ can thus be detected by $1^{st}$ order peaks in Raman spectra, for instance the $LO_3$ or $TO_4$ modes. The Raman spectra of $SrTiO_3$ films measured at 10 K are shown in FIG. 3B. It was noted that the intensity of the $LO_3$ and $TO_4$ peaks in Ti-rich $SrTiO_3$ films was higher than for $SrTiO_3$ films within the stoichiometric growth window. The normalized intensity $I_{TO_4}/I_{2nd\ order}$ was used to quantitatively compare the $1^{st}$ order peak intensities (FIG. 3C). Again, within the 11 to 21 mTorr TTIP gas inlet pressure range, $I_{TO_4}/I_{2nd}$ order values were significantly lower than that of $SrTiO_3$ films grown at higher TTIP gas inlet pressures. Notably, the normalized $1^{st}$ order peak intensities within the growth window determined by XRD show small variations, whereas the XRD results are not distinguishable. For example, the 11 mTorr film has a statistically significant difference in $1^{st}$ order peak intensities compared with those grown at TTIP gas inlet pressure range from 12 to 21 mTorr. This indicates that low temperature Raman spectroscopy is more sensitive to SrTiO$_3$ structural changes than XRD, especially in the SrO-rich region.

Figures 4A, 4B:
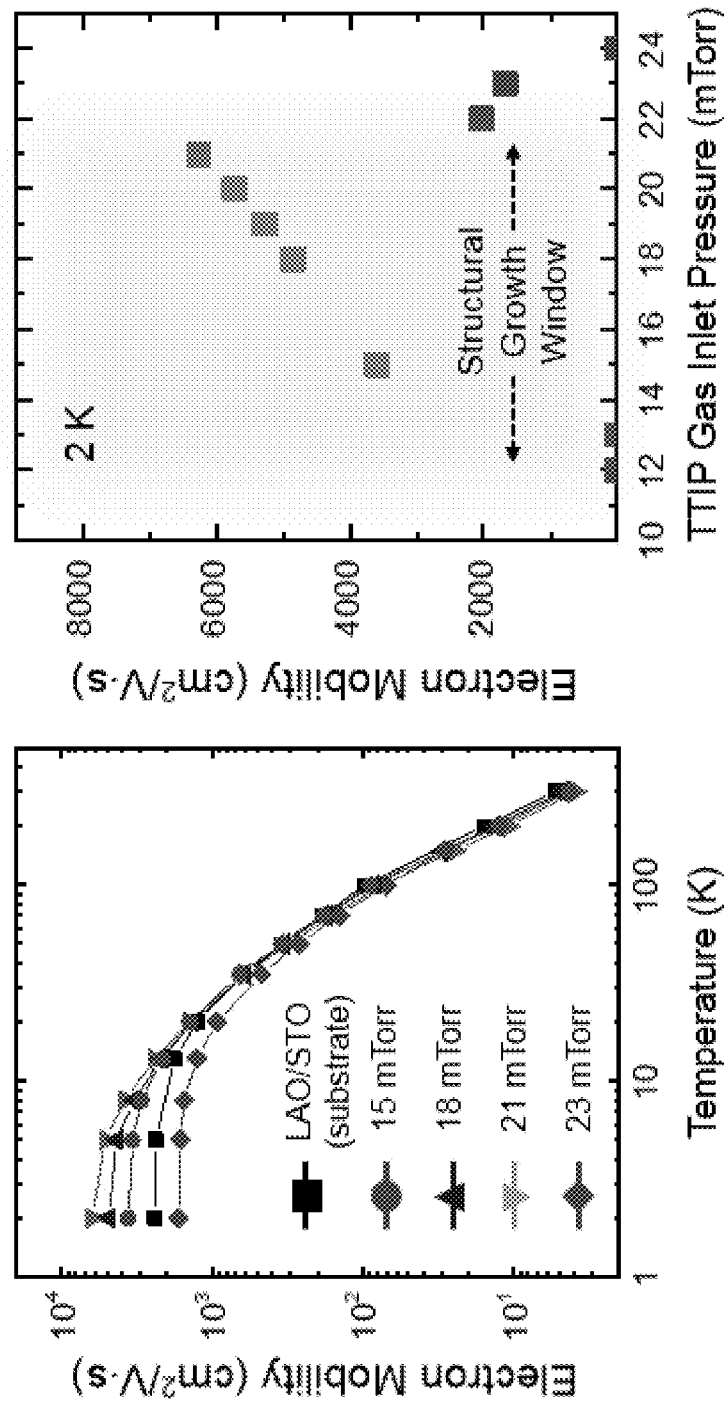
FIG. 4A-FIG. 4C depict electrical properties of 2DEG in LAO/STO interfaces.
Figure 4C:
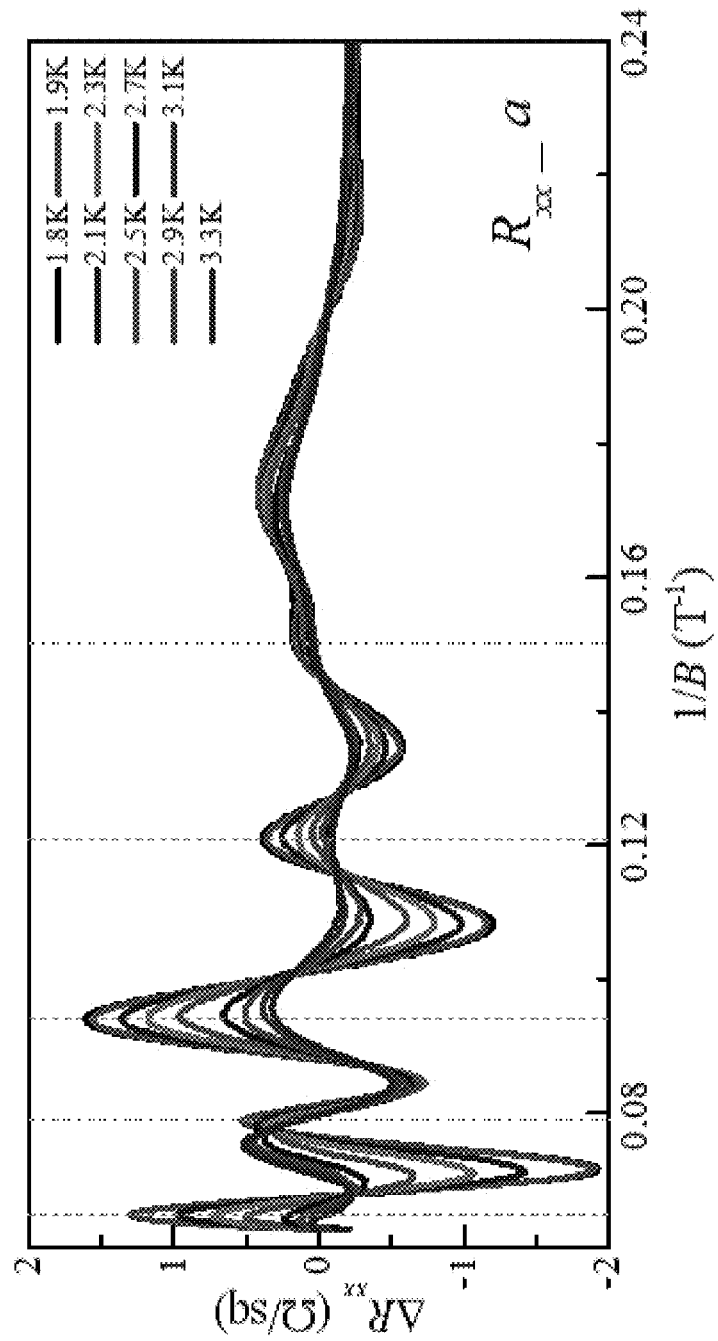

Using the SrTiO$_3$ films as templates, epitaxial LaAlO$_3$ layers were grown on SrTiO$_3$ by a conventional PLD to investigate the effect of the reduction in point defects on properties of the interfacial 2DEG. The film thicknesses of LaAlO$_3$ and SrTiO$_3$ were fixed at 5 u.c. and 12 u.c., respectively, with TTIP growth pressures spanning the stoichiometric growth window. The RHEED patterns and oscillations of each layer were obtained. The highest electron mobility of ~6,260 cm$^2$/V·s at 2 K was for the SrTiO$_3$ film that was grown under 21 mTorr TTIP gas inlet pressure (FIG. 4A). This value is substantially higher than that in the LaAlO$_3$/SrTiO$_3$ substrate, ~2,400 cm$^2$/V·s, where the LaAlO$_3$ layer was prepared by the same growth condition. At low temperatures, in high magnetic fields and high electron mobility, the resistance $R_{xx}$ will oscillate as B is swept, giving rise to Shubnikov-de Haas (SdH) oscillations. FIG. 4C shows clear SdH oscillations for the sample grown at 21 mTorr TTIP gas inlet pressure, indicating a low level of defect concentration. From the SdH oscillations, a partial carrier density of 1.7×10$^{12}$ cm$^{-2}$, an effective mass of 1.0 m$_e$ (m$_e$ is the bare electron mass), and a quantum mobility of the order of 1500 cm$^2$/V·s can be extracted, consistent with or much better than the values reported for LaAlO$_3$ grown under optimized conditions on a bulk single-crystalline SrTiO$_3$. (A. D. Caviglia, et al., Phys. Rev. Lett. 105, 236802 (2010).) Interestingly, the defect concentration, i.e. related to the electron mobility, seems to be dependent on the level of TTIP inlet, and it monotonically decreases with increasing TTIP pressure within the structural growth window, as shown in FIG. 4B. This indicates that point defect concentration varies within the structural growth window, resulting in dramatic mobility enhancement.

Figure 5B:
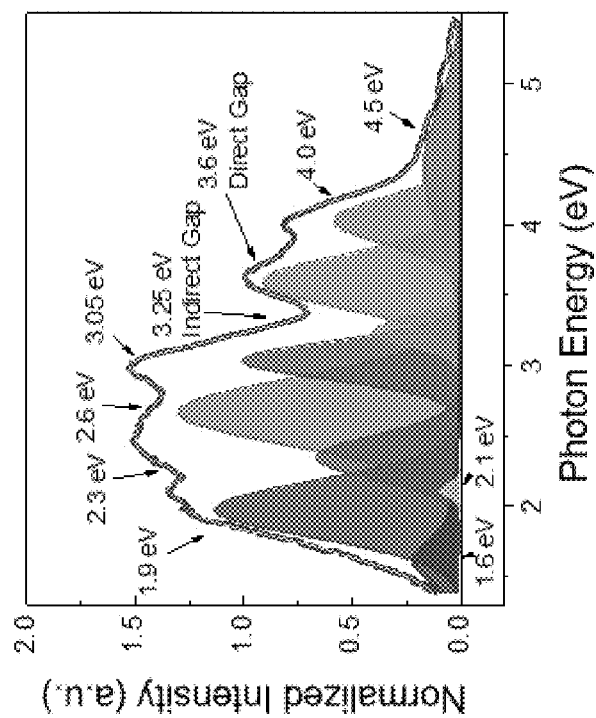
FIG. 5A-FIG. 5D depict depth-resolved cathodoluminescence spectroscopy measurement of STO films.
Figure 5A:
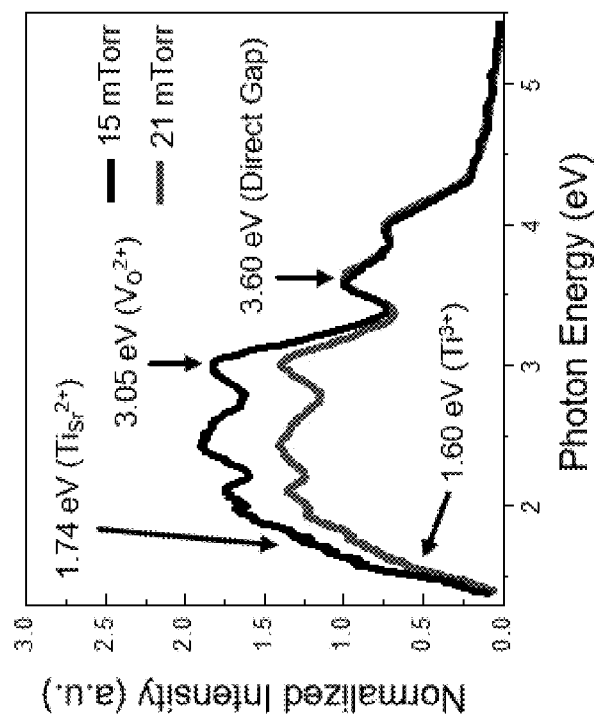
Figure 5D:
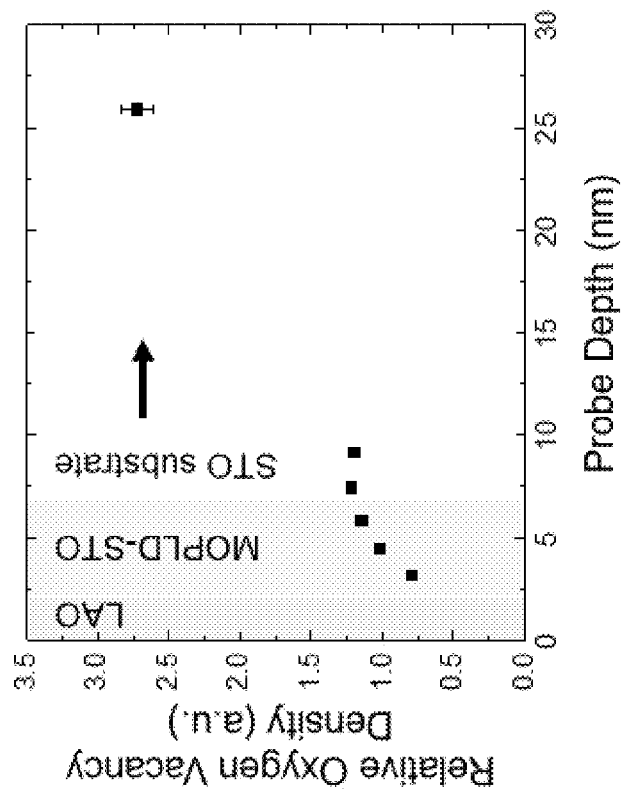
Figure 5C:
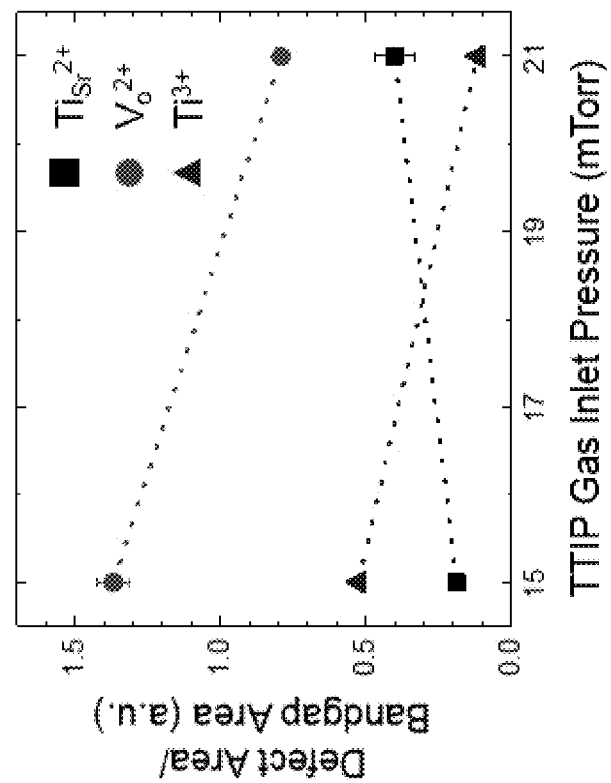

Depth-resolved cathodoluminescence (DRCLS) was performed to directly measure the point defects and their distribution in MOPLD-grown SrTiO$_3$ films. FIG. 5A shows DRCLS spectra of the LaAlO$_3$/MOPLD-grown SrTiO$_3$/SrTiO$_3$ samples where SrTiO$_3$ films were grown at the TTIP inlet pressure of 15 and 21 mTorr, respectively. The 0.3 kV beam energy was used for the measurement to collect data from the SrTiO$_3$ film regions. There is a clear difference in intensities of two samples at the energy range from ~1.5 to ~3.4 eV where the spectra were normalized with respect to the band gap (3.6 eV) peak intensity. Each spectrum was deconvoluted using 10 Gaussian curves (FIG. 5B), and the area of each defect was normalized with respect to the area of the band gap peak. The data fit as a superposition of contributions from previously identified sources. (D. Lee, et al., Phys. Rev. Mater. 2, 060403(R) (2018).) In FIG. 5C, relative point defect densities of Ti$_{Sr}^{2+}$, V$_O^{2+}$, and Ti$^{3+}$ are plotted for different TTIP inlet pressures for MOPLD-grown SrTiO$_3$ film in the LaAlO$_3$/SrTiO$_3$/SrTiO$_3$ heterostructure. As the TTIP inlet pressure is increased, the amount of Ti$_{Sr}^{2+}$ is increased, whereas the amount of V$_O^{2+}$ is decreased. This result is also supported by density functional theory (DFT) calculation. From the phase diagram as a function of chemical potential of Sr, Ti, and O, the formation energy of V$_O^{2+}$ and Ti$_{Sr}^{2+}$ could be calculated as a function of $\Delta\mu_O$. When a higher TTIP flux is employed during the SrTiO$_3$ growth, the relative chemical potential of Sr is decreased while those of Ti and O are increased, since a single TTIP molecule possesses not only one Ti atom but also four oxygen atoms. Thus, for a simplification, for a constant $\mu_{Ti}$ condition, the $\Delta\mu_O$ can be taken proportionally to the amount of TTIP during the growth. Thus, when $\Delta\mu_O$ is increased, the formation energies of V$_O^{2+}$ and Ti$_{Sr}^{2+}$ get smaller and larger, respectively, supporting the DRCLS results. Although both V$_O^{2+}$ and Ti$_{Sr}^{2+}$ act as scattering centers at low temperature, larger electron mobilities with higher TTIP flux were observed, as shown in FIG. 4B. This dependence of mobility on TTIP inlet pressure implies that the total amount of V$_O^{2+}$ and Ti$_{Sr}^{2+}$ decreases with increasing TTIP flux during growth. The fact that the amount of Ti$^{3+}$ is also lower in the higher TTIP inlet pressure region (FIG. 5C) is another piece of indirect evidence of decreased total number of positively charged defects in the STO films. From the depth profile of the oxygen vacancy index, it was further confirmed that the amount of oxygen vacancies in the STO film which was grown using TTIP inlet pressure of 21 mTorr was even smaller than that in the STO bulk single crystal (FIG. 5D).

The origin of point defect concentration variation within the structural growth window by thermodynamics was also considered. It is proposed that adjusting the TTIP pressure amounts to tuning the chemical potential of TiO$_{2-x}$ in the system, as discussed above. STO is known to be a line compound in the binary system of SrO and TiO$_2$, but in the very narrow composition range at the vicinity of STO, there should exist some degree of solubility due to entropy of mixing.

The Gibbs-Duhem relationship for $\mu_{TiO2-x}$ can be described as follows.

$$\mu_{TiO2-x} = -SdT + VdP \qquad (1)$$

In this experiment, the growth temperature was fixed at 900° C. so that the dG/dP value was always positive, indicating that the chemical potential of TiO$_{2-x}$ decreases with decreasing partial pressure of TTIP. Therefore, the equilibrium Sr/Ti ratio in STO thin films is determined by the relative position between the free energy curve of STO and the chemical potential of TiO$_{2-x}$. When the TTIP gas inlet pressure is too low, the tangential line meets Sr$_2$TiO$_4$, as observed for samples grown at 9 and 10 mTorr. If the TTIP gas inlet pressure is high, such as when 21 mTorr was used, the equilibrium composition of STO is slightly shifted to the Ti-rich side, which results in the formation of more Ti$_{Sr}^{2+}$. This is not due to the relative Ti chemical potential increase; rather, the resulting Ti$_{Sr}^{2+}$ increase may be directly related to the formation of a solid-solution between Ti and Sr at the Ti-rich side. Again, for this reason, the amount of V$_O^{2+}$ is decreased, consistent with the higher mobility at the interface of LaAlO$_3$/MOPLD-grown SrTiO$_3$.

Methods

Thin film fabrication. Single crystalline SrTiO$_3$ (001) substrates were used for this study. SrTiO$_3$ substrates were soaked in DI-water for 30 min and in buffered-BHF for 1 min to make a TiO$_2$-terminated surface. By subsequent annealing at 1000° C. for 6 h in 1 atm O$_2$ atmosphere, an atomically smooth surface could be obtained. In the MOPLD process, TTIP gas served as a working gas during a laser ablation of a SrO single crystal target. A KrF excimer laser ($\lambda$=248 nm) was used with ~0.7 J/cm$^2$ of energy fluence and 2 Hz of repetition rate on the SrO target. TTIP gas was supplied by a gas injector and variable leak valves, where TTIP gas inlet pressure was controlled by a capacitance manometer vacuum gauge. During the SrTiO$_3$ film growth, the substrate temperature was kept at 900° C., and any other gas except TTIP was introduced in the chamber. The sample thickness was evaluated from RHEED oscillations. After the growth of the SrTiO$_3$ film, samples were cooled down to 600° C., and then oxygen gas was backfilled with ~600 Torr for the post-annealing. For LaAlO$_3$ layers, the conventional PLD method was employed. The growth temperature, oxygen partial pressure, energy fluence, and repetition rate for LaAlO$_3$ were 750° C., 7.5×10$^{-5}$ Torr, ~1.0 J/cm$^2$, and 1 Hz, respectively. After the growth, samples were annealed at 600° C. in ~150 Torr of O$_2$ for 1 h in order to achieve equilibrium oxygen concentration.

XRD measurement. The crystal structure of samples was analyzed by a high-resolution four-circle XRD machine (Bruker D8 advance) using CuKα1 radiation.

Raman spectroscopy measurement. Raman spectra were measured using a Horiba Jobin Yvon T64000 triple spectrometer equipped with a liquid-nitrogen-cooled multichannel charge-coupled device detector. Spectra were recorded in backscattering geometry in the temperature range of 10-300 K, using a variable temperature closed cycle He cryostat. The 325 nm line of a He—Cd laser line was used for excitation; laser power density was below 0.5 W/mm$^2$ at the sample surface, low enough to avoid any noticeable local heating. The TO$_4$ peak (at ~550 cm$^{-1}$) was used for analysis of symmetry breakdown due to point defects, since this peak was the most distinctive and did not overlap with the second order features. The ratio of the integrated intensity of the TO$_4$ peak to that of the 2$^{nd}$ order peak at 620 cm$^{-1}$ (plotted in FIG. 3C) was used to determine the stoichiometric growth window.

Electrical characterization. The SdH measurements were performed using a four-probe Van der Pauw method with ultrasonically wire-bonded aluminum wires as electrodes. A CRYOGENIC cryogen-free measurement system was employed to characterize the temperature-dependent SdH oscillations in a perpendicular magnetic field up to 16 T at low temperatures from 1.8-3.1 K in steps of 0.2 K. The amplitude of the quantum oscillations at different temperatures was extracted from these measurements by subtracting a 2$^{nd}$ order polynomial background. The data analysis is based on the method published elsewhere. (A. D. Caviglia, et al., *Phys. Rev. Lett.* 105, 236802 (2010) and Y. Z. Chen, et al., *Nat. Commun.* 4, 1371 (2013).)

Depth-Resolved Cathodoluminescence Spectroscopy Measurement and Analyses

Theoretical calculations. For the calculation of defects, the density functional theory (DFT) band structure approach was used, as implemented in the Vienna ab initio simulation package (VASP). (G. Kresse, et al., *Phys. Rev. B* 59, 1758 (1999); ibid B 54, 11169 (1996).) The projected augmented wave (PAW) method was used to approximate the electron-ion potential. (P. E. Blöchl, *Phys. Rev. B* 50, 17953 (1994).) To treat exchange and correlation effects, both the local density approximation (LDA) and the semi-empirical LDA+U method were used within a rotationally invariant formalism, for a better description of the localized transition metal d electrons. (J. P. Perdew, et al., *Phys. Rev. B* 23, 5048 (1981); Vladimir I Anisimov, et al., *J. Phys. Condens. Mat.* 9, 767 (1997); and S. L. Dudarev, et al., *Phys. Rev. B* 57, 1505 (1998).) Here, (U−J)=5 eV was chosen for the 3d orbitals of Ti atoms, as this value of U provides good description of the lattice parameters. The calculated lattice constant is 3.9 Å, similar to that measured experimentally, and the band gap is 2.4 eV and includes defect states. Defect calculations were performed in 135 atoms in a 3×3×3 cubic supercell. After creating one such defect in the perfect supercell, the internal coordinate was relaxed until the Hellman-Feynman forces were less than 0.01 eV/A. In the calculation, a kinetic energy cutoff of 340 eV was used as the kinetic energy cutoff, and a 6×6×6 Monkhorst-Pack grid of k points Brillouin zone integration was used. (Hendrik Monkhorst, et al., *Phys. Rev. B* 13, 5188 (1976).) In all calculations, the spin polarization was turned on to include the effect of the local moment introduced by defect. To create an ionized (charged) defect, electrons were added to or removed from the system, and a compensating jellium background was included. Formation enthalpy of the defect D is energy cost to add (remove) an atom of charge q to (from) an otherwise perfect host and is calculated using relation: $\Delta H_f(D,q)=E(D,q)-E_H+\mu_{removed}-\mu_{added}+q(E_V+E_F)$, where E(D,q) is the energy of the host with the defect, $E_H$ is energy without defect, and $E_F$ is the electrochemical potential of the charge q that is usually measured with respect to the host valence band maximum ($E_V$).

Example 2: LAO/STO/STO, LAO/STO/LSAT, and LAO/STO/DSO heterostructures were also grown, and their current-voltage (I-V) characteristics were measured to establish that electrically conductive interfaces can be formed for unstrained complex oxide films, tensile strained complex oxide films, and compressive strained complex oxide films having a critical thickness for 2DEG formation of less than 10 u.c.

STO films were grown on (001) STO, (001) LSAT, and (001) DSO substrates. 12 u.c. thick STO layers were fabricated by MOPLD, using the procedures described in Example 1. Then 5 u.c. thick LAO layers were grown by conventional PLD (using a LAO single crystal as a target). For I-V characteristics, samples were mounted and connected to chip carriers by aluminum wire-bonding. Two probe measurement was performed for measuring I-V curves after making a contact between chip carriers and probe tips. The I-V curves for the LAO/STO/STO, LAO/STO/LSAT, and LAO/STO/DSO heterostructures are shown in FIGS. 6A, 6B, and 6C, respectively. These results demonstrate that electrically conductive interfaces, 2DEG, were achieved for each of the heterostructures.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A 2DEG-forming heterostructure comprising:
   a DyScO$_3$ substrate or a GdScO$_3$ substrate;
   a tensilely strained SrTiO$_3$ film on the DyScO$_3$ substrate or the GdScO$_3$ substrate; and
   a LaAlO$_3$ film on the tensilely strained SrTiO$_3$ film,
   wherein a 2DEG is formed at the interface between the SrTiO$_3$ film and the LaAlO$_3$ film.

2. The heterostructure of claim 1, wherein the $LaAlO_3$ film has a thickness of 10 unit cells or lower.

3. The heterostructure of claim 1, wherein the $LaAlO_3$ film has a thickness in the range from 5 unit cells to 9 unit cells.

4. The heterostructure of claim 1, wherein the $SrTiO_3$ film has a thickness of 20 unit cells or lower.

5. The heterostructure of claim 1, wherein the substrate is the $DyScO_3$ substrate.

6. The heterostructure of claim 5, wherein the $LaAlO_3$ film has a thickness of 10 unit cells or lower.

7. The heterostructure of claim 6, wherein the $LaAlO_3$ film has a thickness in the range from 5 unit cells to 9 unit cells.

8. The heterostructure of claim 6, wherein the $SrTiO_3$ film has a thickness of 20 unit cells or lower.

9. The heterostructure of claim 1, wherein the substrate is the $GdScO_3$ substrate.

10. The heterostructure of claim 9, wherein the $LaAlO_3$ film has a thickness of 10 unit cells or lower.

11. The heterostructure of claim 10, wherein the $LaAlO_3$ film has a thickness in the range from 5 unit cells to 9 unit cells.

12. The heterostructure of claim 10, wherein the $SrTiO_3$ film has a thickness of 20 unit cells or lower.

\* \* \* \* \*